(12) United States Patent
Leib et al.

(10) Patent No.: US 8,273,671 B2
(45) Date of Patent: *Sep. 25, 2012

(54) GLASS MATERIAL FOR RADIO-FREQUENCY APPLICATIONS

(75) Inventors: Jürgen Leib, Freising (DE); Dietrich Mund, Obersüssbach (DE)

(73) Assignee: Schott AG, Mainz (DE)

( * ) Notice: Subject to any disclaimer, the term of this patent is extended or adjusted under 35 U.S.C. 154(b) by 773 days.

This patent is subject to a terminal disclaimer.

(21) Appl. No.: 10/514,876

(22) PCT Filed: May 23, 2003

(86) PCT No.: PCT/EP03/05414
§ 371 (c)(1),
(2), (4) Date: Jul. 14, 2005

(87) PCT Pub. No.: WO03/100846
PCT Pub. Date: Dec. 4, 2003

(65) Prior Publication Data
US 2007/0166520 A1    Jul. 19, 2007

(30) Foreign Application Priority Data
May 23, 2002    (DE) .................................. 102 22 609

(51) Int. Cl.
*C03C 3/091*    (2006.01)
(52) U.S. Cl. ............... 501/66; 501/55; 501/65; 428/209; 428/426
(58) Field of Classification Search .................. 428/209, 428/426, 428, 432–434; 501/55, 65, 66
See application file for complete search history.

(56) References Cited

U.S. PATENT DOCUMENTS

| | | | |
|---|---|---|---|
| 2,965,519 A | 12/1960 | Christensen | |
| 3,417,393 A | 12/1968 | Cooke et al. | |
| 3,543,394 A * | 12/1970 | Matlow .......................... | 438/353 |
| 4,090,006 A * | 5/1978 | Havas et al. .................... | 428/81 |
| 4,492,717 A | 1/1985 | Pliskin et al. | |
| 4,508,815 A | 4/1985 | Ackmann et al. ............. | 430/314 |
| 4,564,997 A | 1/1986 | Matsuo et al. | |
| 4,819,039 A | 4/1989 | Chi et al. | |
| 5,092,032 A | 3/1992 | Murakami | |

(Continued)

FOREIGN PATENT DOCUMENTS

DE    1934217    6/1971

(Continued)

OTHER PUBLICATIONS

Pongratz et al. "Plasma ion-assisted deposition: A promising technique for optical coatings" J. Vac. Sci. Technol. A 10(4), Jul./Aug. 1992.*

(Continued)

*Primary Examiner* — Nicholas D'Aniello
(74) *Attorney, Agent, or Firm* — Ohlandt, Greeley, Ruggiero & Perle, LLP

(57) ABSTRACT

A glass material for producing insulation layers is provided. The glass material can improve the radio-frequency properties of radio-frequency substrates or radio-frequency conductor arrangements. In one embodiment, the glass material for producing insulation layers for radio-frequency substrates or radio-frequency conductor arrangements is an applied layer with a layer thickness in the range between 0.05 μm and 5"mm and has a loss factor tan δ of less than or equal to $70*10^{-4}$ in at least a frequency range above 1 GHz.

22 Claims, 16 Drawing Sheets

U.S. PATENT DOCUMENTS

| | | | |
|---|---|---|---|
| 5,264,399 A * | 11/1993 | Casey et al. | 501/32 |
| 5,597,767 A | 1/1997 | Mignardi et al. | |
| 5,639,325 A * | 6/1997 | Stevens et al. | 438/22 |
| 5,710,082 A | 1/1998 | Kawakami et al. | 501/65 |
| 5,929,510 A | 7/1999 | Geller et al. | |
| 6,127,025 A | 10/2000 | Bhatt et al. | |
| 6,444,517 B1 * | 9/2002 | Hsu et al. | 438/238 |
| 2001/0018787 A1 * | 9/2001 | Shin et al. | 29/25.01 |
| 2001/0026864 A1 | 10/2001 | Mori et al. | 428/209 |
| 2002/0011653 A1 * | 1/2002 | Ferrari et al. | 257/678 |
| 2003/0080408 A1 | 5/2003 | Farnworth et al. | |

FOREIGN PATENT DOCUMENTS

| | | |
|---|---|---|
| DE | 4236264 C1 | 9/1993 |
| DE | 19846691 | 11/1999 |
| DE | 10042653 | 3/2002 |
| EP | 1168609 | 1/2002 |
| JP | 61003431 | 1/1986 |
| JP | 61151038 | 7/1986 |
| JP | 238775 | 3/1990 |
| JP | 6037251 | 2/1994 |
| JP | 6112710 | 4/1994 |
| JP | 7118060 | 5/1995 |
| JP | 10335779 | 12/1998 |
| JP | 11177208 | 7/1999 |
| JP | 20011289926 | 10/2001 |

OTHER PUBLICATIONS

"Dictionary of Engineering Materials"; 2004; John Wiley & Sons, Inc.; p. 480.

Office Action from corresponding European Patent Application No. 03 735 449.5 dated Sep. 9, 2008.

McNally, J.J.; "Ion Assisted Deposition" in "Handbook of Plasma Processing Technology"; 1990; Noyes Publications; pp. 466-482.

Office Action dated Jul. 19, 2011 corresponding to European Patent Application No. 03755118.1-2203.

Appeal Examiner's Office Letter dated Feb. 23, 2011 corresponding to Japanese Patent Application No. 2004-508402.

Appeal Examiner's Office Letter dated Oct. 11, 2011 corresponding to Japanese Patent Application No. 2004-508402.

* cited by examiner

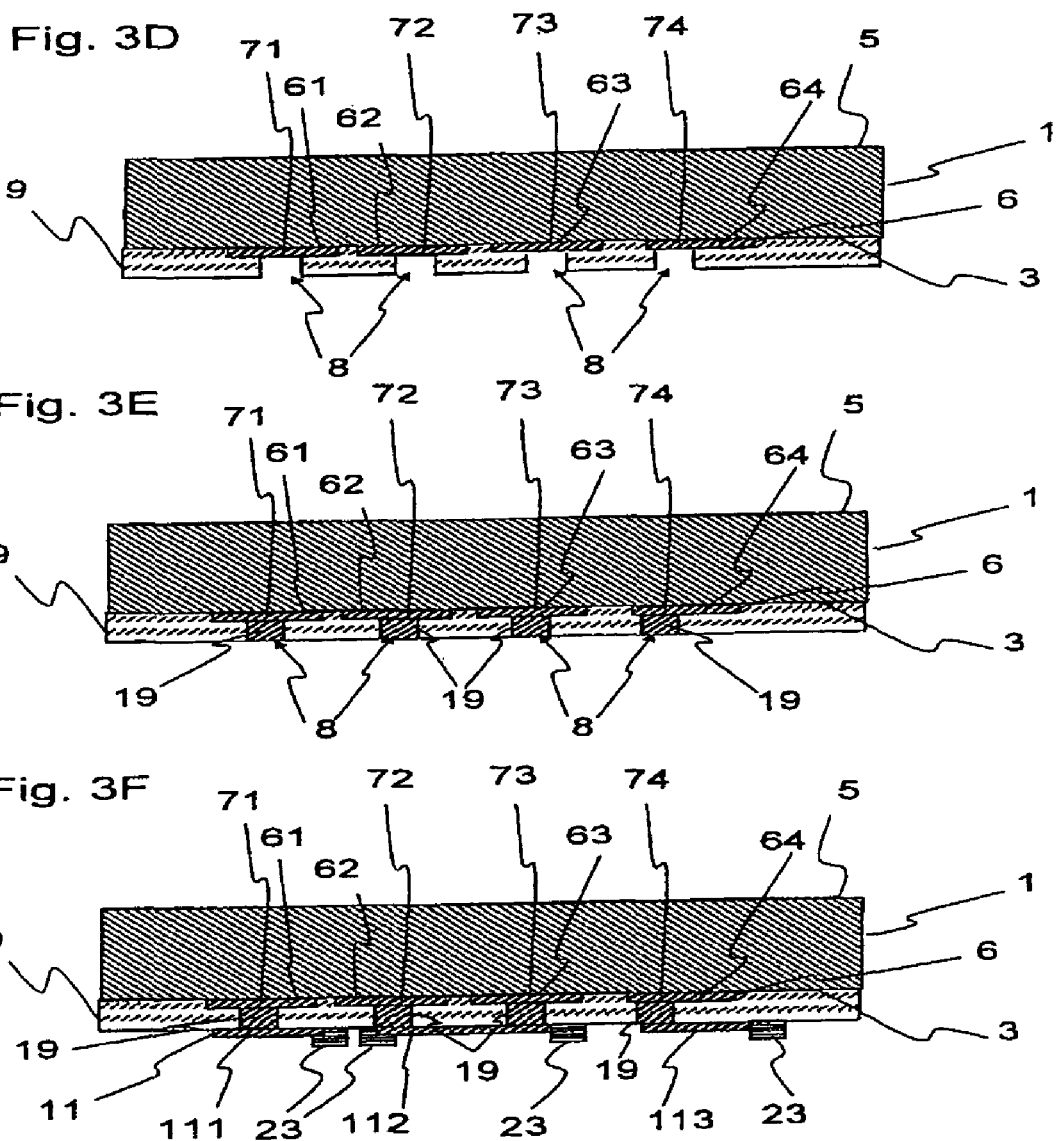

Diagrammatic layer arrangement for RF measurement

$h1=3\mu m$, $h2=3\mu m$

Metal thickness $t = 0.5\ \mu m$

Open coplanar waveguide

| Parameter | Value structure 1 | Value structure 2 |
|---|---|---|
| G | 5μm | 10μm |
| W | 42μm | 76μm |
| L | 1, 5, 20, 50mm | 1, 5, 20, 50mm |

CPW structure 3

Buried coplanar waveguide

Large vias at ground
small vias in the signal line

| Parameter | Value |
| --- | --- |
| G | 13 μm |
| W | 76 μm |
| L | 1, 5, 20, 50mm |

Fig. 11

| Glass material | Metal material | Waveguide type | Gap G width in μm | Strip width W in μm | Length L in mm | Specimen designation |
|---|---|---|---|---|---|---|
| Glass 1 8329 | Al | Coplanar | 10 | 76 | 5 | G1ACPW2_2 |
| Glass 1 8329 | Al | Buried, coplanar | 13 | 76 | 5 | G1ACPW3_2 |
| Glass 2 G018-189 | Al | Coplanar | 10 | 76 | 5 | G2ACPW2_6 |
| Glass 2 G018-189 | Al | Buried, coplanar | 13 | 76 | 5 | G2ACPW3_2 |

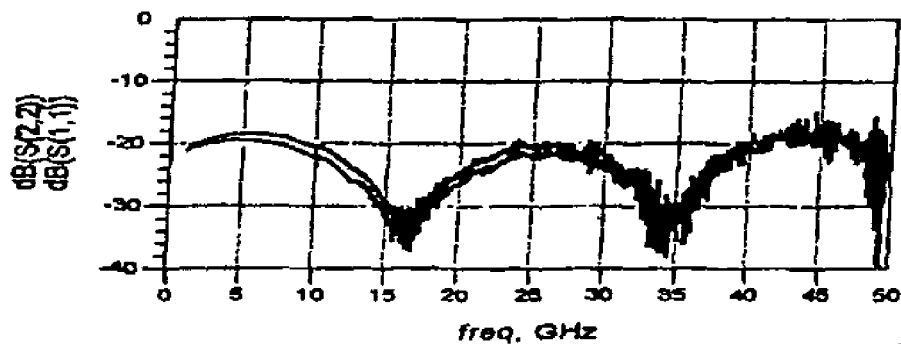
Fig. 12: Magnitude of the scatter parameter S11 for specimen G1ACPW2_2
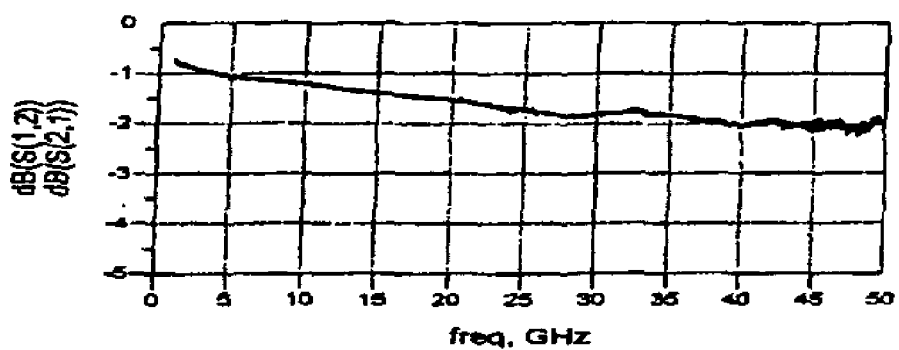
Fig. 13: Magnitude of the scatter parameter S21 for specimen G1ACPW2_2
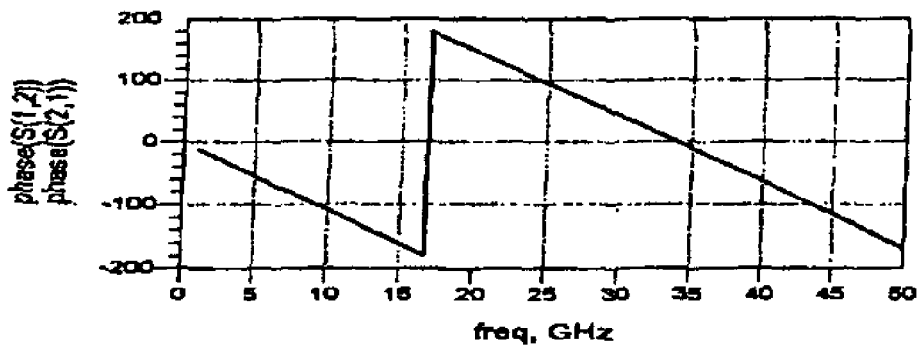
Fig. 14: Phase profile S21 for specimen G1ACPW2_2

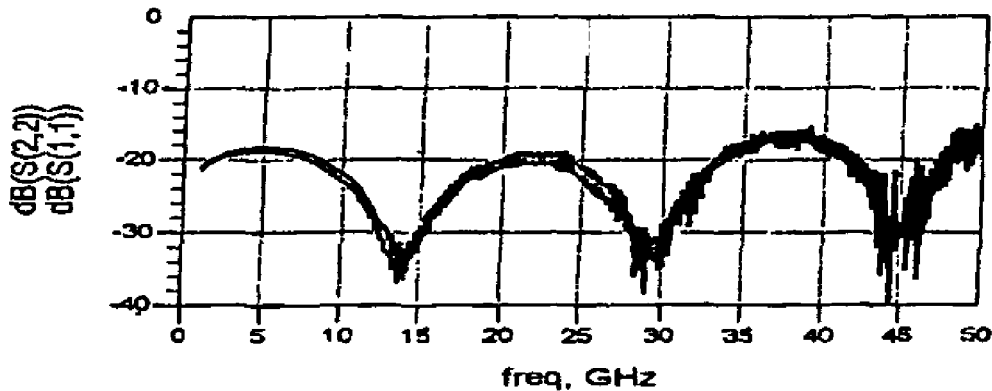
Fig. 15: Magnitude of the scatter parameter S11 for specimen G1ACPW3_2
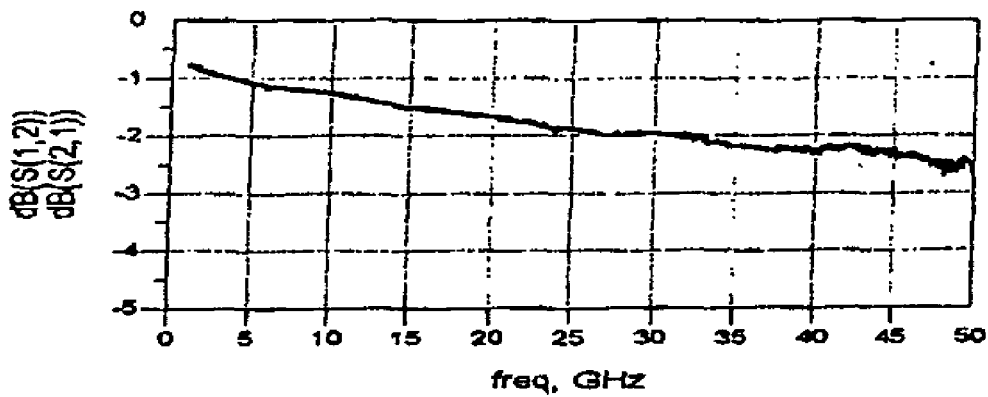
Fig. 16: Magnitude of the scatter parameter S21 for specimen G1ACPW3_2
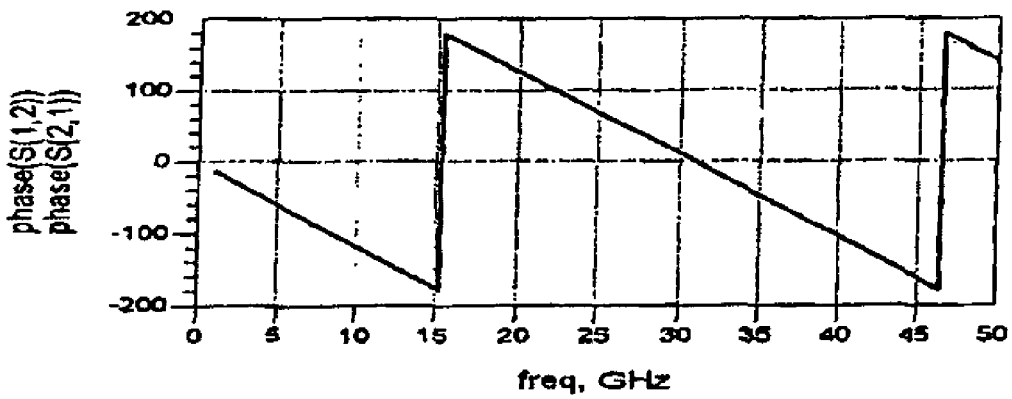
Fig. 17: Phase profile S21 for specimen G1ACPW3_2

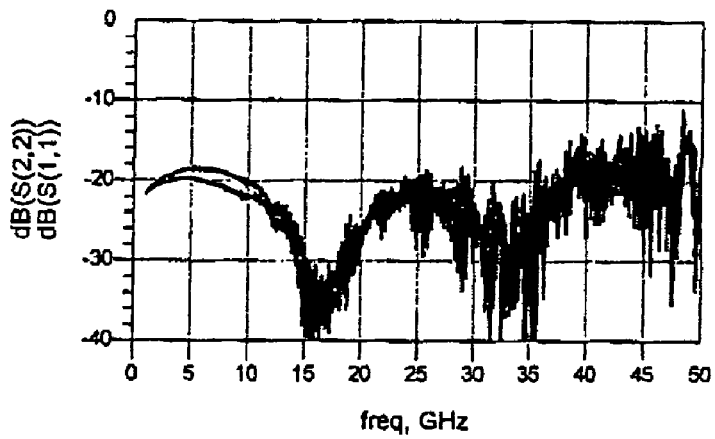
Fig. 18: Magnitude of the scatter parameter S11 for specimen G2ACPW2_6
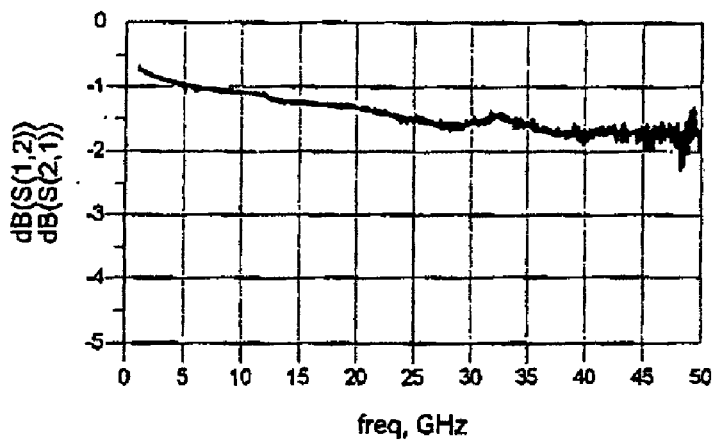
Fig. 19: Magnitude of the scatter parameter S21 for specimen G2ACPW2_6
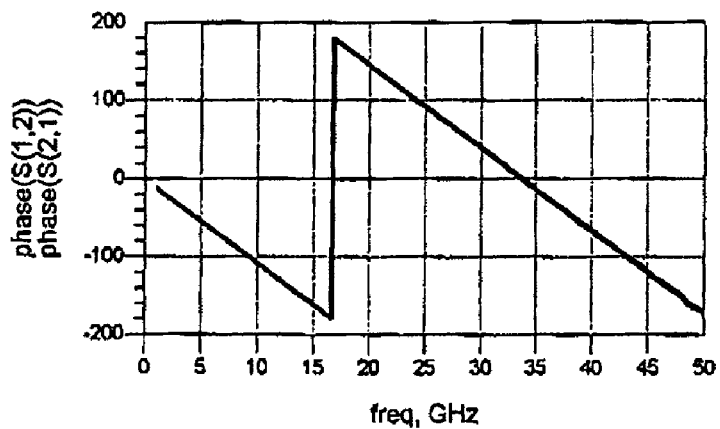
Fig. 20: Phase profile S21 for specimen G2ACPW2_6

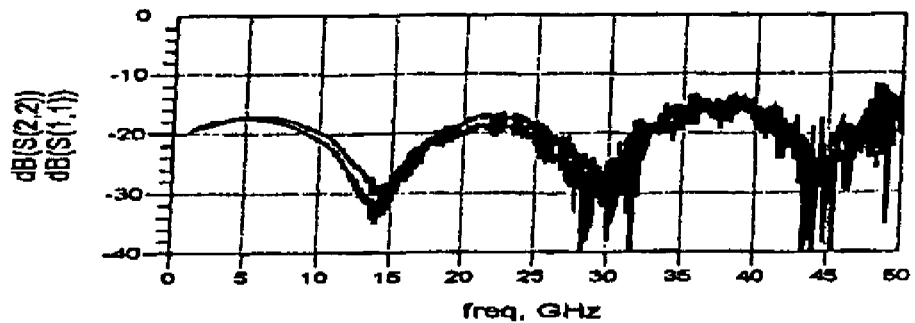
Fig. 21: Magnitude of the scatter parameter S11 for specimen G2ACPW3_2
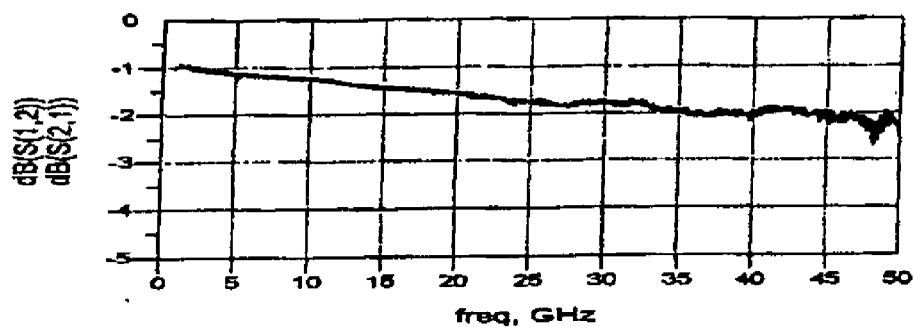
Fig. 22: Magnitude of the scatter parameter S21 for specimen G2ACPW3_2
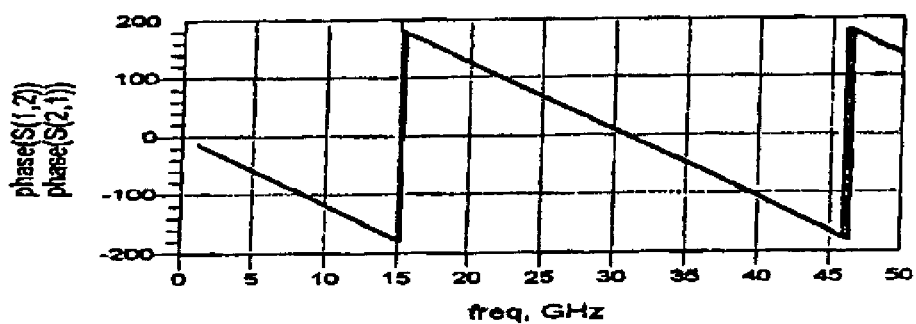
Fig. 23: Phase profile S21 for specimen G2ACPW3_2

GLASS MATERIAL FOR RADIO-FREQUENCY APPLICATIONS

BACKGROUND OF THE INVENTION

1. Field of the Invention

The invention deals in general terms with the field of radio-frequency circuits, and in particular the invention relates to a glass material which is suitable for the production of conductor structures appropriate for radio-frequency applications on a substrate, and also to a radio-frequency substrate.

2. Description of Related Art

It is known that the trend in the semiconductor industry is toward ever higher data transmission rates. Frequencies in the gigahertz range lead to increased signal attenuation at the feed and emission systems. Hitherto, primarily printed ceramic (HTCC) and glass-ceramic (LTCC) multiple layers, which after they have been printed with conductive layers, laminated and sintered, realize a three-dimensional or multilayer wiring for a radio-frequency circuit, have been used for systems of this type. Moreover, organic multiple layers which are not hermetic are also used. However, at high frequencies, the transmission losses in wiring systems of this type increase on account of the attenuation in the interconnects. The use of HTCC and LTCC materials at very high frequencies—generally over 40 GHz—is restricted by the relatively high dielectric constants (DK) and loss angles (tan δ) in these frequency ranges. The HTCC and LTCC ceramics have an inevitable granularity which has an adverse effect on the radio-frequency properties and leads to the interconnects integrated therein having a surface roughness corresponding to the granularity. This surface roughness leads to increased line losses.

A further cause of the high degree of attenuation in known radio-frequency conductor substrates resides, inter alia, in the application of the interconnects, usually by means of thick-film technology, in particular by means of screen printing. The interconnects produced using this technology have a considerable inhomogeneity and roughness of the interconnect contours. The inhomogeneities of the interconnects act as antennas, leading to extensive losses through radiation.

Furthermore, sintering inevitably leads to shrinkage of the substrates, which makes it difficult to accurately maintain desired dimensions.

More recent developments have been toward replacing the disadvantageous thick-film technology by using various PVD processes to apply the interconnects by evaporation coating or sputtering. However, the sintering of the HTCC or LTCC materials to produce the wiring stack required in previous processors still presents a major problem. For example, sintering of an LTCC ceramic requires a temperature of at least 950° C. A temperature of 1500° C. is required for the sintering of HTCC ceramics. These temperatures lead to changes in the interconnect structures, and the choice of interconnect materials is limited.

BRIEF SUMMARY OF THE INVENTION

The invention is therefore based on the object of providing improved materials, in particular in terms of the radio-frequency properties, for interconnect systems and of improving the radio-frequency properties of radio-frequency conductor arrangements.

This object is achieved, in a very surprisingly simple way, by a glass material for producing insulation layers for radio-frequency substrates or radio-frequency conductor arrangements, a process for producing a component with a radio-frequency conductor arrangement or radio-frequency interconnect system, and a component with a radio-frequency conductor arrangement, as disclosed by the independent claims. Advantageous configurations and refinements form the subject matter of the corresponding subclaims.

A glass material according to the invention for producing insulation layers for radio-frequency substrates or radio-frequency conductor arrangements has, as an applied layer, in particular with a layer thickness in the range from 0.05 μm to 5 mm, preferably in the range from 0.05 μm to 1 mm, a loss factor tan δ of less than or equal to $70*10^{-4}$ in at least one frequency range above 1 GHz.

LTCC and HTCC materials are valued inter alia on account of their good encapsulation properties, which also enable a substrate of this type to be used as part of the housing of components. The encapsulation properties of glass layers are even better, since glass has an extremely low permeability to most gases.

On account of the low loss factor of the glass material applied as a layer, the glass material according to the invention is eminently suitable for radio-frequency applications.

A glass material according to the invention, as an applied layer, in particular with a layer thickness in the range between 0.05 μm and 5 mm, may particularly advantageously have a loss factor tan δ of less than or equal to $50*10^{-4}$ at a frequency of 40 GHz. This low loss factor makes the glass material according to the invention eminently suitable for use for radio-frequency applications even at very high frequencies in the microwave range.

According to a refinement of the invention, the loss factor tan δ of a layer with a layer thickness in the range between 0.05 μm and 5 mm, which has been applied using a glass material according to the invention, is even less than or equal to $30*10^{-4}$ at a microwave frequency of 40 GHz. This loss factor is even lower than the loss factors of LTCC and HTCC substrates in the microwave range.

According to a particularly advantageous embodiment of a glass material according to the invention, the material for depositing a layer can be evaporated. This allows the deposition of insulation layers using a glass material according to the invention by PVD coating or by evaporation coating onto a base. This is particularly advantageous inter alia because the thermal loading on the base, for example the substrate, is only moderate. Moreover, the deposition of glass layers by evaporation of the glass material, for example from a target arranged opposite and at a distance from the surface to be coated and comprising glass material according to the invention, allows the production of very thin, homogeneous insulation layers. The use of the glass material therefore also allows an increase in the integration density of radio-frequency components, such as for example of radio-frequency substrates.

A glass material according to this embodiment of the invention can accordingly be evaporated in such a way that a glass layer or vitreous layer is formed on that surface of a substrate which faces the evaporation source and is exposed to the vapor emitted from the source. This property of a glass material according to the invention is not provided by all glass materials. With many glass materials, there is no formation of glass layers or vitreous layers, but rather non-vitreous oxide layers are all that are deposited, and such layers generally then do not have good encapsulation and/or radio-frequency properties.

In particular glasses which comprise an at least binary system of materials are also particularly suitable as evaporation-coating glasses or glass materials which can be evaporated and deposited again as vitreous or glass layers. Glass layers which have been deposited by evaporation of glasses of this type have particularly good encapsulation and radio-frequency properties on account of their lack of defects.

It is particularly expedient if a glass material according to the invention can be evaporated by electron beam evaporation. Electron beam evaporation allows a very small source spot to be produced on a target comprising the glass material at the point of incidence of the electron beam, and the power of the electron beam is then concentrated on this spot. Electron beam evaporation also allows high deposition rates to be achieved on the substrate which is to be coated.

To allow simple processing of the glass material, for example to form a glass target for the electron beam evaporation, it is advantageous if the glass material has a working point of less than 1300° C. The term working point is in this context generally understood as meaning the temperature at which the viscosity of the glass is $10^4$ dPas.

To achieve low radiation losses from conductor structures, it is advantageous if the glass material, as an applied layer, in particular with a layer thickness in the range between 0.05 μm and 5 mm, has a relative dielectric constant $\in_R$ of less than or equal to five in at least one frequency range above 1 GHz.

In an advantageous refinement, the glass material, as an applied layer, in particular with a layer thickness in the range between 0.05 μm and 5 mm, may have a relative dielectric constant $\in_R$ of less than or equal to 5, in particular a relative dielectric constant $\in_R$ of 4±0.5, in the microwave range at a frequency of 40 GHz as well.

According to a further embodiment of the invention, the glass material, as an applied layer, in particular with a layer thickness in the range between 0.05 μm and 5 mm, has a coefficient of thermal expansion $\alpha_{20-300}$ in the range from $2.9 \times 10^{-6}$ K$^{-1}$ to $3.5 \times 10^{-6}$ K$^{-1}$ in a temperature range from 20° C. to 300° C. This expansion coefficient is, inter alia, well matched to the expansion coefficient of silicon or Borofloat®33 glass. This makes it possible, for example, to substantially avoid temperature stresses when using silicon or Borofloat®33 glass as substrate materials.

Even better thermal matching is achieved if the glass material, as an applied layer, in particular with a layer thickness in the range between 0.05 μm and 5 mm, has a coefficient of thermal expansion $\alpha_{20-300} = (3.2 \pm 0.2) \times 10^{-6}$ K$^{-1}$ in a temperature range from 20° C. to 300° C.

Yet another embodiment of the invention provides a glass material which, in order to reduce thermal stresses when used as an insulation layer for silicon substrates, as an applied layer, in particular with a layer thickness in the range between 0.05 μm and 5 mm, has a coefficient of thermal expansion which differs from the coefficient of thermal expansion of the substrate material, for example of silicon, by less than $1 \times 10^{-6}$ K$^{-1}$ in a temperature range from 20° C. to 300° C.

For the long-term encapsulation properties of a glass layer which has been produced using glass material according to the invention, it is expedient if the glass layer is as resistant as possible to attacks from acids or alkalis. Therefore, one embodiment of the invention provides a glass material which, as an applied layer, is acid-resistant to acid resistance class $\leqq 2$. According to a further embodiment of the invention, the glass material, as an applied layer, is alkali-resistant to alkali resistance class $\leqq 3$.

Glass materials whose constituents are within the following composition range have proven suitable:

| Components | Composition range |
|---|---|
| $SiO_2$ | 40-90, |
| $B_2O_3$ | 10-40, |
| $Al_2O_3$ | 0-5, |
| $K_2O$ | 0-5, |
| $Li_2O$ | 0-3, |
| $Na_2O$ | 0-3. |

The numerical values given above are in percent by weight.

The radio-frequency properties and the evaporation properties can be improved in particular using glass materials according to the invention which include the following constituents, in percent by weight:

| Components | Composition range |
|---|---|
| $SiO_2$ | 60-90, |
| $B_2O_3$ | 10-30, |
| $Al_2O_3$ | 0-3, |
| $K_2O$ | 0-3, |
| $Li_2O$ | 0-2, |
| $Na_2O$ | 0-2. |

Glass materials according to the invention preferably have the following composition, in percent by weight:

| Components | Glass1 | Glass2 |
|---|---|---|
| $SiO_2$ | 84 ± 5 | 71 ± 5 |
| $B_2O_3$ | 11 ± 5 | 26 ± 5 |
| $Na_2O$ | 2 ± 0.2 | 0.5 ± 0.2 |
| $Li_2O$ | 0.3 ± 0.2 | 0.5 ± 0.2 |
| $K_2O$ | 0.3 ± 0.2 | 1.0 ± 0.2 |
| $Al_2O_3$ | 0.5 ± 0.2 | 1.0 ± 0.2 |

The following properties were measured for a glass of this type, having a composition of 71% by weight of $SiO_2$, 26% by weight of $B_2O_3$, 1% by weight of $Al_2O_3$, 1% by weight of $K_2O$ and in each case 0.5% by weight of $Li_2O$ and $Na_2O$:

Coefficient of thermal expansion between 20° C. and 300° C.: $\alpha_{20-300} = 3.2 \times 10^{-6}$ K$^1$, Refractive index: nd=1.465, Transformation temperature: $T_g$=466° C., Softening point: $T_{EW}$=742° C., Working point: $T_{VA}$=1207° C., Relative dielectric constant at 40 GHz: $\in_R$=3.9, Loss factor at 40 GHz: tan δ=$26 \times 10^{-4}$, Density: ρ=2.12 g·cm$^{-3}$, Water resistance class: 2, Acid resistance class: 2, Alkali resistance class: 3.

This particularly suitable glass is also referred to below as glass G018-189.

A further embodiment is given by a suitable glass having the composition 84% by weight of $SiO_2$, 11% by weight of $B_2O_3$, <2% by weight of $Al_2O_3$, 2.0% by weight of $Na_2O$ and in each case 0.3% by weight of $Li_2O$ and $K_2O$, for which the following properties were measured:

Coefficient of thermal expansion between 20° C. and 300° C.: $\alpha_{20\text{-}300}=2.75\times10^{-6}\,K^{-1}$,
Refractive index: nd=1.47,
Transformation temperature: $T_g$=562° C.,
Relative dielectric constant at 40 GHz: $\in_R$=5,
Loss factor at 40 GHz: tan $\delta=40\times10^{-6}$,
Density: $\rho=2.2\,g\cdot cm^{-3}$,
Water resistance class: 1,
Acid resistance class: 1,
Alkali resistance class: 2.

This glass, which is likewise particularly suitable, is also referred to below as glass 8329.

The compositions given above relate to the glass material prior to application. The layer which has been applied using a glass material of this type may also have a composition which deviates from the above. By way of example, the composition in the layer may vary from the composition of the glass material according to the invention if the layer is deposited by evaporation coating and the components of the glass material have different vapor pressures.

A glass material as described above may particularly advantageously be used to produce an insulation layer for a radio-frequency conductor structure or a radio-frequency substrate.

A corresponding process for producing a component with a radio-frequency conductor arrangement may for this purpose advantageously comprise the steps of:
  depositing a structured glass layer having at least one opening over a contact-connection region on a substrate using a glass material in particular as described above, and
  applying at least one conductor structure to the glass layer, which has electrical contact with the contact-connection region.

In particular on account of the advantages listed above, consideration is given to depositing the glass layer by evaporation of the glass material.

Accordingly, the process according to the invention can be used to produce a component with a radio-frequency conductor arrangement, which comprises
  a substrate having at least one contact-connection region,
  on at least one side of the substrate, a glass layer, which has at least one opening with a via, the via being in electrical contact with the contact-connection region, and
  at least one conductor structure on the glass layer, which is in contact with the via.

In this context, the term component is to be understood as encompassing not only an electronic component. In the context of the present invention, the term component also encompasses a coated substrate with a radio-frequency conductor arrangement or radio-frequency conductor system, which then as a unit serves as a carrier and for the connection of further components. Similar components with carrier material and radio-frequency conductor system are generally also referred to as radio-frequency substrates.

Suitable substrate materials include, inter alia, silicon, ceramic, glass or even plastics. It is also possible to use composite materials, for example glass-plastic laminates, in particular including those with integrated conductor arrangements. As well as silicon, it is also possible, for example, to use other semiconductor materials, such as for example gallium arsenide. Silicon, ceramic and glass are particularly suitable substrate materials on account of their coefficient of thermal expansion being very similar to that of the glass applied by evaporation coating.

The glass layer is particularly preferably deposited by the evaporation of glass material according to the invention. However, it is also conceivable for the glass layer to be deposited on that surface of the substrate which is to be coated by, for example, sputtering from a target comprising glass material according to the invention.

According to a refinement of the invention, the glass layer is applied by evaporation coating through plasma ion assisted deposition (PIAD). In this case, an ion beam is directed onto the surface which is to be coated during the evaporation-coating process. This leads to further densification and a reduction in the defect density.

As well as conductor structures, such as for example interconnects, it is also possible for one or more passive electrical components to be applied to the glass layer and brought into contact with or connected to the conductor structure. By way of example, it is possible for a capacitor, a resistor, a coil, a varistor, a PTC, an NTC, to be applied to the glass layer as passive electrical component, or for a filter element to be applied to the glass layer.

A particularly advantageous embodiment of the invention provides for the production of a three-dimensional or multilayer conductor system on a substrate. For this purpose, the steps of depositing a structured glass layer and of applying at least one conductor structure are carried out a number of times. The individual glass layers and/or conductor structures may be structured differently in order to produce a three-dimensional conductor system, in particular also having passive components, which are formed on one or more individual layers of the multilayer conductor system. In this case, it is advantageously possible for a conductor structure which is applied at a later stage to be connected to or brought into contact with a contact-connection region of a conductor structure applied at an earlier stage, so that an electrical connection is created between two individual layers of the conductor arrangement and the individual layers can be electrically linked to one another. Accordingly, it is thereby possible to form a component which has a multilayer conductor arrangement with at least two glass layers which have been applied by evaporation coating and each have a conductor structure applied to them, with a conductor structure on a first glass layer being in electrical contact with a conductor structure on a second glass layer via a via.

However, it is also possible for two or more vias which are positioned above one another or offset to be brought into contact in individual glass layers located above one another, so that, by way of example, a contact-connection region of the substrate is through-contacted to the outside through a plurality of glass layers or is connected to a conductor structure of a further layer.

Furthermore, an advantageous embodiment of the process provides for the step of depositing a structured glass layer having at least one opening over a contact-connection region by evaporation coating to include the steps of:
  applying a structured interlayer, which covers the contact-connection region,
  applying a glass layer by evaporation coating to the substrate and the structured interlayer which is present thereon, the thickness of the glass layer preferably being less than that of the structured interlayer, and
  removing the structured interlayer, with those regions of the glass layer which are located on the structured interlayer being lifted with it.

In addition to photolithographic resist structuring, it is also possible for a structured interlayer of this type to be produced directly, for example by printing.

Furthermore, a refinement of the process provides for a conductive material which projects with respect to regions adjacent to the contact-connection region and is covered by the structure of the interlayer to be applied to the at least one contact-connection region prior to the application of the glass layer by evaporating coating. This produces a conductive, raised structure on the contact-connection region. This step can be carried out, for example, by the interlayer being photolithographically structured together with a layer of conductive material, in which case the layer of conductive material is removed from the regions which surround the contact-connection region together with the interlayer. The glass layer can then advantageously be applied by evaporation coating in such a way that its thickness substantially corresponds to the thickness of the applied, conductive material, so that after the glass layer above the contact-connection region has been lifted off, a substantially planar surface is present.

According to yet another refinement of the invention, first of all a glass layer having at least one opening is deposited directly above a contact-connection region or advantageously with a lateral offset, and the at least one opening in the glass layer is then filled with conductive material. This too creates a substantially planar surface as a base for the subsequent application of one or more conductor structures.

Furthermore, it has proven advantageous if the substrate, during the application of the glass layer by evaporation coating, is held at a temperature between 50° C. and 200° C., preferably between 80° C. and 120° C. The heating of the substrate inter alia prevents the formation of mechanical stresses. Moderate heating is also advantageous for the morphology of the glass layers; at these substrate temperatures, it was possible to produce particularly pore-free glass layers.

A base pressure in the evaporation-coating chamber which is held at most in the range of $10^{-4}$ mbar, preferably in the range of $10^{-5}$ mbar or below, is equally positive for the required layer quality.

To produce continuous glass layers with a low pore density on the substrate, moreover, it is expedient if that surface of the substrate which is to be coated has a surface roughness of less than 50 μm.

Yet another advantageous refinement of the process according to the invention provides for the glass layer to be applied by evaporation coating with a deposition rate of at least 0.5 μm of layer thickness per minute. This high deposition rate can readily be achieved without detriment to the layer quality of the glass layers and allows a short production time to be implemented. Other vacuum deposition processes, such as for example sputtering, by contrast, only achieve deposition rates of a few nanometers per minute.

Moreover, the application of the conductor structure may advantageously comprise the steps of applying a negatively structured interlayer and then depositing conductive material on the base which has been coated with the interlayer. The base in this case comprises the substrate and/or the substrate with one or more applied glass layers and conductor structures arranged thereon. This interlayer may also be photolithographically structured or produced by structured printing.

The substrate itself may already have a conductor structure, for example in the form of interconnects. These may also advantageously be applied directly to the substrate prior to the step of depositing the structured glass layer. In particular, it is then possible for a contact-connection region to be provided on an interconnect which has been applied direct to the substrate, and for this contact-connection region then to be brought into contact with a conductor structure which is subsequently applied to an insulating glass layer. It is in this way possible to create a multilayer interconnect system which is appropriate for radio-frequency applications, or a multilayer conductor arrangement, which is appropriate for high-frequency applications, after the steps of depositing a glass layer and then applying at least one conductor structure to the glass layer have been carried out just once. Of course, in this context it is still possible to create further layers of a three-dimensional interconnect system, in particular also with passive components integrated therein, by repeatedly carrying out the steps of depositing a glass layer and applying a conductor structure.

Yet another embodiment of the invention provides for the substrate to comprise a semiconductor substrate with one or more active semiconductor regions on a first side of the substrate. By way of example, the substrate may comprise an integrated semiconductor circuit. In this case, the at least one conductor structure may be connected to a connection location of the active semiconductor region while it is being applied, so that there is electrical contact with the conductor structure and therefore also with the conductor arrangement.

Hitherto, for example in LTCC modules, the path has been taken of integrating individual semiconductor building blocks in monolithic form in cavities in the ceramic, so that the ceramic forms the carrier for the semiconductor building blocks. By contrast, the invention allows the reverse route to be taken, with the conductor arrangement being applied direct to a chip and the latter therefore serving as carrier for the conductor arrangement.

A further embodiment of the invention provides a substrate which has at least one via. Then, the at least one conductor structure can be connected to the via through the substrate while it is being applied. This embodiment of the invention inter alia allows structures on one side of the substrate to be connected to a radio-frequency conductor arrangement on another side of the substrate.

If the single-layer or multilayer conductor arrangement on the substrate is complete, it is additionally possible for a further, final glass layer to be deposited by evaporation coating so as to cover the layers which have previously been applied. To allow contact-connection of the conductor arrangement on the substrate, it is advantageously possible to create at least one via through the final glass layer. This glass layer can be produced in the same way as the glass layers of the conductor arrangement beneath it. This further layer can serve as an insulation layer which insulates the conductor arrangement with respect to the outside.

For economic production of components according to the invention, it is also advantageous if the substrate is coated while it is still joined to the wafer, so that a multiplicity of components are processed simultaneously.

The international patent application filed by the Applicant on the same date as the present application entitled "Process for producing a component with a conductor arrangement suitable for radio-frequency applications" discloses components with a radio-frequency conductor arrangement, and processes for producing them, in which glass layers deposited by evaporation coating are used as insulation layers. The glass material according to the invention can in particular also be used for the processes and components described in the above application, and the content of disclosure of the above application in this respect is hereby expressly incorporated by reference.

The processes and components described here and in the above-referenced, incorporated international patent application in the name of the present Applicant entitled "Process for producing a component having a conductor arrangement which is suitable for radio-frequency applications" are particularly suitable for the use of glass material according to the invention. Of course, however, it is also possible to produce similar components or other types of components for radio-frequency applications using the glass material. Accordingly, one aspect of the invention relates in general terms to the use of a glass material according to the invention for producing an insulation layer for a radio-frequency conductor structure or a radio-frequency substrate in order to improve the radio-frequency properties of such elements.

BRIEF DESCRIPTION OF THE SEVERAL VIEWS OF THE DRAWINGS

In the text which follows, the invention is explained in more detail on the basis of exemplary embodiments and with reference to the drawings, in which identical and similar components are provided with identical reference numerals and the features of various embodiments can be combined with one another. In the drawing:

FIG. 11 shows a list of properties for measured specimens, the measured values being illustrated in the following FIGS. 12 to 23, FIGS. 12 to 14 show the magnitude of the scatter parameters and their phase profile for specimen G1ACPW2_2 (glass 8329), FIGS. 15 to 17 show the magnitude of the scatter parameters and their phase profile for the specimen G1ACPW3_2 (glass 8329), FIGS. 18 to 20 show the magnitude of the scatter parameters and their phase profile for the specimen G2ACPW2_6 (glass G018-189), and FIGS. 21 to 23 show the magnitude of the scatter parameters and their phase profile for the specimen G2ACPW3_2 (glass G018-189).

DETAILED DESCRIPTION OF THE INVENTION

Figure 1:
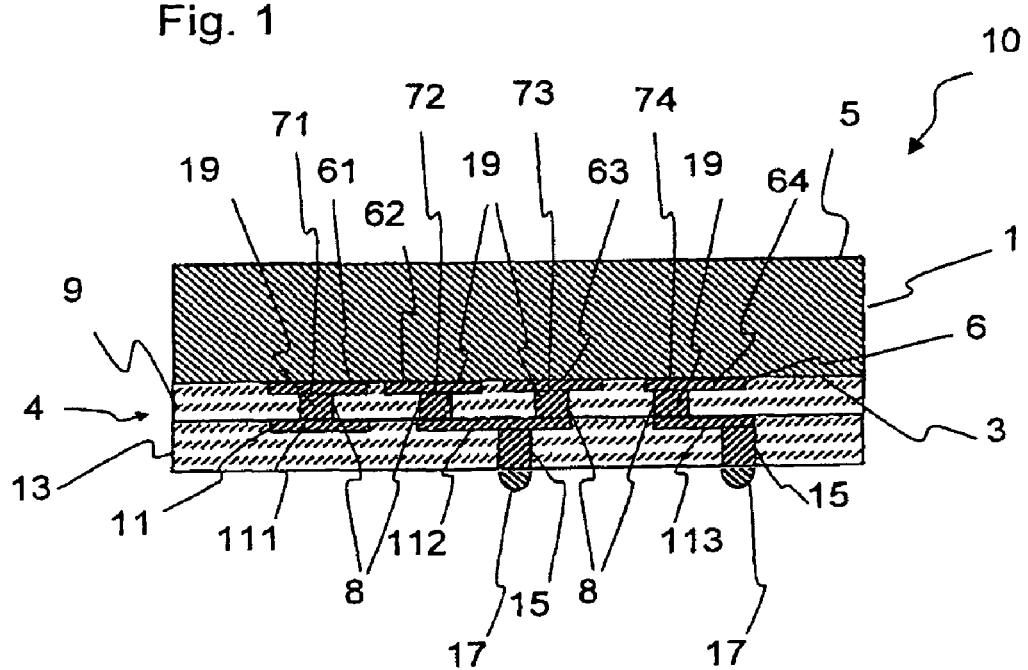
FIG. 1 shows a sectional illustration of a first embodiment of the invention.

FIG. 1 shows a simplified sectional illustration of a first embodiment of a component according to the invention, which is denoted overall by reference numeral 10 and has a substrate 1 with a first side 3 and a side 5 on the opposite side from the side 3, as well as a radio-frequency conductor arrangement which is arranged on the first side 3 of the substrate and is denoted overall by reference numeral 4. A layer 6 comprising conductor structures 61-64 is arranged on the substrate 1. The conductor structures 61-64 may, for example, be interconnects. Moreover, some of the conductor structures 61-64 may also be formed as passive electrical components. Contact-connection regions 71-74 are defined on these conductor structures 61-64 on the first side 3 of the substrate 1. After the conductor structures of the layer 6 have been applied, an insulating glass layer 9 is then deposited in structured form on the first side 3 of the substrate by evaporation coating, such that this glass layer has openings 8 above the contact-connection regions 71-74. These openings 8 are filled with a conductive material 19, so that the openings in combination with the conductive fillings in each case create vias through the insulating glass layer 9. A layer 11 with further conductor structures 111, 112, 113 is applied to the glass layer 9. The conductor structures 111, 112, 113 are each in contact with at least one of the vias, so that the conductor structures 111, 112, 113 are electrically connected to the conductor structures 61-64 of the layer 6. Consequently, the substrate has a multilayer conductor arrangement, the individual layers 6 and 11 of which are separated from one another by an insulating glass layer 9 with excellent radio-frequency properties.

Depending on the intended use, the glass layer 9 may have a thickness in the range from 0.05 µm to 5 mm, with glass layers produced by evaporation coating expediently having a thickness in the range from 0.05 µm to 1 mm.

A further, final evaporation-coating glass layer 13, which serves as outer insulation for the conductor structures 111, 112, 113, is deposited on the layer 11 comprising the conductor structures 111, 112, 113. To allow contact-connection of these conductor structures, moreover, further vias 15, which are in contact with the conductor structures 111, 112, 113 are present in the final evaporation-coating glass layer 13. In addition, soldering beads 17 are applied to the vias 15 in order for the component 10 to be, for example, secured to an SMT circuit board and connected.

To produce the layers 9, 13, it is preferable for a target comprising glass material according to the invention to be evaporated by electron beam evaporation and deposited on the substrate 1.

The glass material used to produce the insulation layers 9, 13 is in particular a glass according to the invention, which, as an applied layer having a layer thickness in the range between 0.05 µm and 5 mm, has a loss factor tan δ of less than or equal to $50*10^{-4}$ at least in a frequency range above 1 GHz.

The above-described glasses 8329 and in particular G018-189 are especially suitable for this purpose, on account of their excellent radio-frequency properties.

Figure 2:
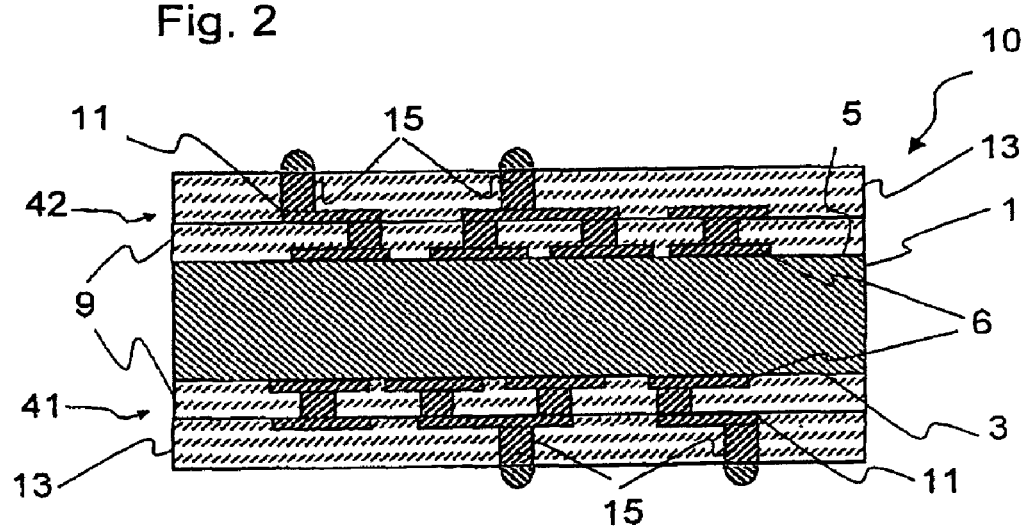
FIG. 2 shows a sectional illustration of a further embodiment of the invention with two conductor arrangements on opposite sides of a substrate, FIGS. 3A to 3H use cross-sectional views to illustrate the steps involved in one embodiment of the process according to the invention.

FIG. 2 shows a sectional illustration of a further embodiment of a component 10 according to the invention. This embodiment has a radio-frequency conductor arrangement 41 and 42 on each of two opposite sides 3 and 5, respectively. The conductor arrangements 41 and 42 are of analogous construction to the conductor arrangement 4 of the embodiment illustrated in FIG. 1.

In detail, the conductor arrangements 41 and 42 once again in each case have a glass layer 9 of glass applied by evaporation coating with openings in which there is conductive material for through-contact purposes in electrical contact with contact-connection regions arranged beneath the openings. Layers 6 with conductor structures, which for their part are in contact with the vias, are in each case arranged on the glass layers 9 of the conductor arrangements 41 and 42. Also as in the embodiment shown in FIG. 1, the conductor structures on the glass layer 9 are covered with further, final evaporation-coating glass layers 13, in which there are vias 15 for connection of the component.

FIGS. 3A to 3G use cross-sectional views to show the steps involved in production of a component according to the invention in accordance with one embodiment of the process according to the invention.

Figure 3A:
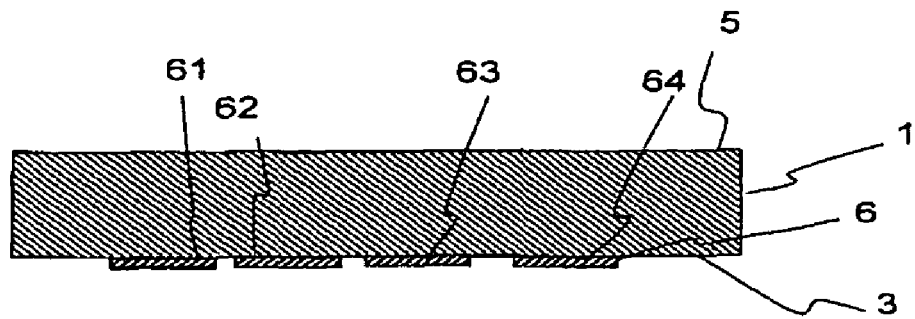
Figure 3B:
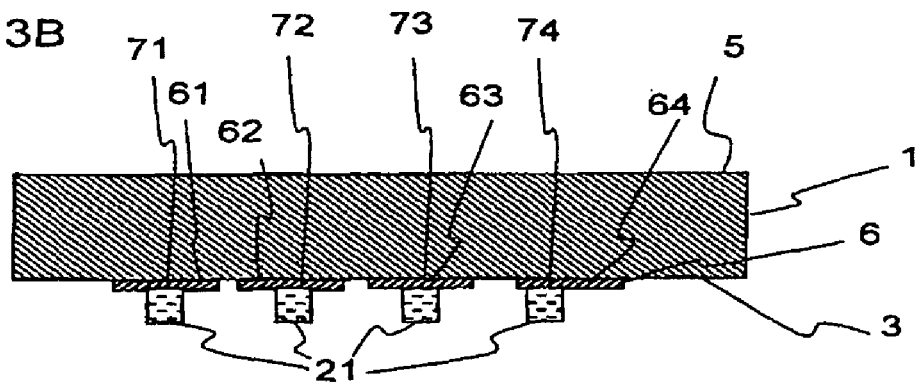

FIG. 3A shows a substrate 1 following a first processing step, in which a layer 6 comprising conductor structures 61-64, such as in particular suitable interconnects, is produced on the side to which the radio-frequency conductor arrangement is applied. These conductor structures may, for example, be contact locations of electronic components of the substrate, which are not shown in FIG. 3A or may be connected to such contact locations.

Then, in further process steps, a glass layer is deposited, this glass layer having openings above contact-connection regions 71-74 of the surface below. For this purpose, first of all, as illustrated on the basis of FIG. 3B, in a further step a structured interlayer having structures 21 which cover the corresponding contact-connection regions 71-74 is applied. This is preferably realized by photolithographic structuring of a suitable photoresist coating. Alternatively, however, it is also possible to use another process, such as for example printing of the surface, to produce the structures 21.

Figure 3C:
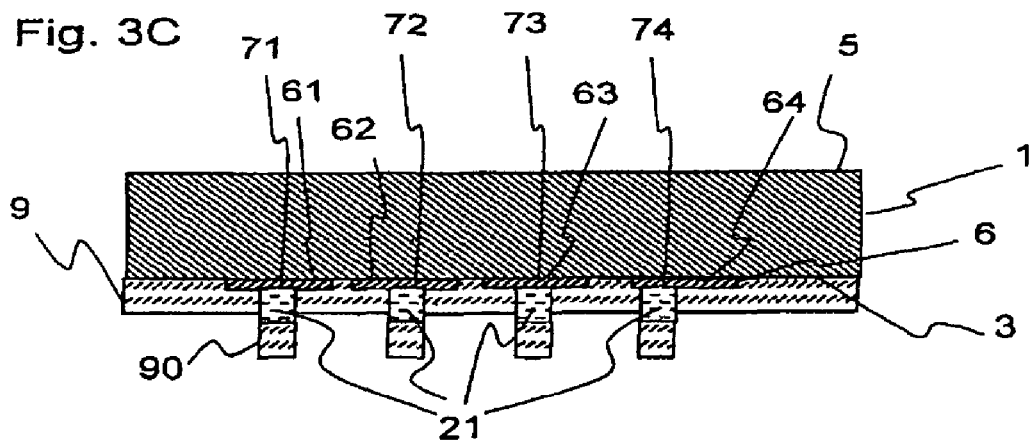

Then, as illustrated by FIG. 3C, a glass layer 9 is applied by evaporation coating, this glass layer covering both the contact-connection regions 71-74, which are covered by the structures 21 of the interlayer, and the surrounding regions of the surface of the base. In this context, it is preferable for the thickness of the glass layer 9 to be less than the thickness of the structured interlayer. The interlayer is then removed, with the regions 90 of the glass layer 9 which cover the structures 21 of the interlayer or are located on the structured interlayer being lifted off with it.

FIG. 3D shows the substrate following this step, which accordingly now has a glass layer 9 with openings 8 above the contact-connection regions 71-74 of the surface below. The openings 8 can then, as shown in FIG. 3E, be filled, for example, with a conductive material 19. Then, a layer 11 comprising conductor structures 111, 112, 113 and passive components 23 can be applied to the glass layer 9, as shown in FIG. 3F. The components 23 may, for example, comprise a capacitor, a resistor, a coil, a varistor, a PTC, an NTC or a filter element. Capacitors and coils can in particular also be realized by conductor structures of individual layers positioned on top of one another and insulated from one another by an evaporation-coating glass layer. By way of example, a conductor structure of the individual layer 6 and a further conductor structure, located above it, of the individual layer 11 can be used for this purpose.

The conductor structures can be applied, for example, by application of a further, negatively structured interlayer and the deposition of electrically conductive material, the conductor structures 111, 112, 113 coming into contact with the conductive material 19 in the openings 8, so that an electrical connection or electrical contact with the respectively associated contact-connection regions 71-74 is also produced.

The conductor structures may also have structures comprising different conductive materials or also semiconductor materials, for example by the application of the conductor structures being carried out in a plurality of steps using different materials. This also allows further functionalities to be integrated in the conductor arrangement, for example thereby creating semiconductor-metal contacts or thermoelectric contacts.

The production of the vias through the glass layer 9 using conductive material 19 shown in FIG. 3E and the application of the conductor structures illustrated in FIG. 3F may also be carried out in a single step. By way of example, the conductor structures 19 can be produced by electroplating, so that the material which is deposited first of all, starting from the contact-connection regions 71-74, fills the openings 8 and then continues to grow on the surface of the glass layer 9, where it forms the conductor structures and also, if intended, may form the passive components 23. It is also possible for the conductor structures 111, 112, 113 to be produced by evaporation coating or sputtering, in which case it is also possible for the contact-connection regions 71-74 and edges of the openings 8 to be coated, so that the corresponding conductor structures come into electrical contact with the contact-connection regions 71-74.

The interlayer can then be removed again, with conductive material which has been deposited on the interlayer also being lifted off and the intended conductor structures and any applied components, including the surface of the glass layer 9, remaining in place.

The steps, shown in FIGS. 3B to 3F, of depositing a structured glass layer having openings over contact-connection regions by evaporation coating using glass material according to the invention, such as for example the glass G018-189, on the substrate and of applying conductor structures, can then be repeated in order to produce further layers of the conductor arrangement. In this case, a conductor structure which is applied at a later stage can be brought into contact with a contact-connection region of a conductor structure applied at an earlier stage.

Figure 3G:
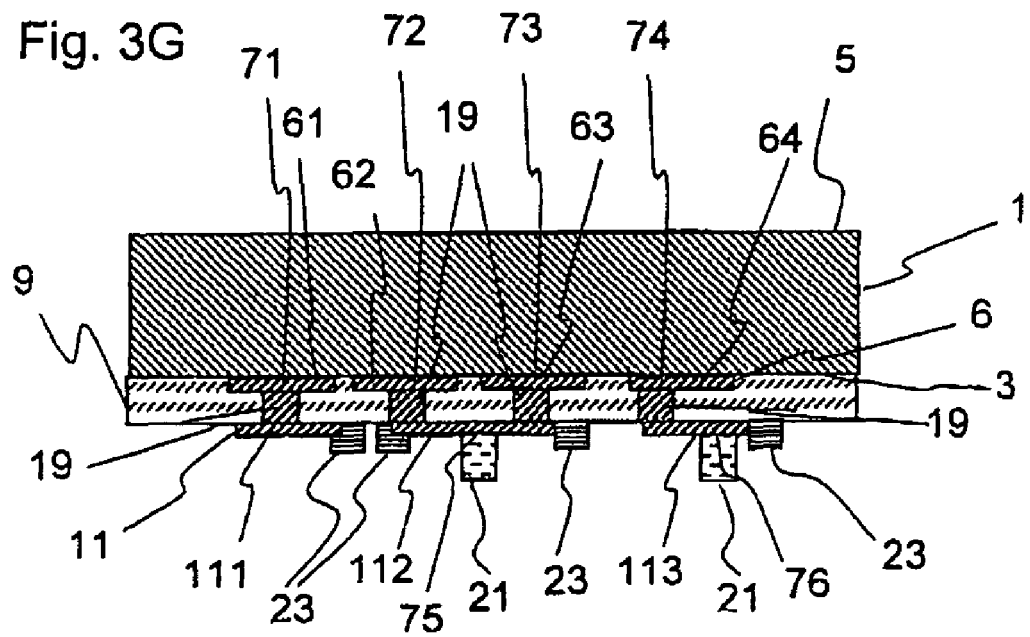
Figure 3H:
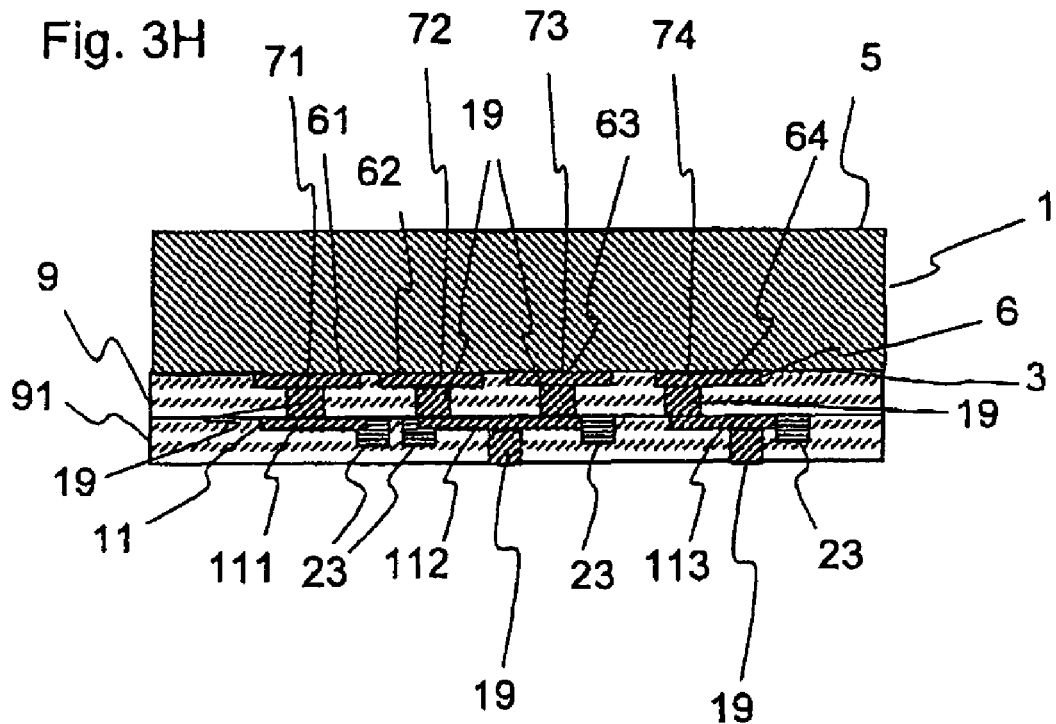

For this purpose, once again, as shown in FIGS. 3F to 3G, an interlayer with structures 21 is applied to intended contact-connection regions 75, 76 of the surface of the coated substrate 1, the contact-connection regions expediently being located on applied conductor structures or also on vias. Then, a further insulating glass layer 91 with vias through openings in the glass layer 91 is produced over the contact-connection regions 75, 76, the production being carried out analogously to the process steps which have been described with reference to FIGS. 3C to 3E.

FIGS. 4A to 4E show a variant of the process steps of the process according to the invention which have been shown with reference to FIGS. 3B to 3E. This variant of the process according to the invention is based on a conductive material, which projects with respect to regions adjacent to the respective contact-connection region and is covered by the structure of the interlayer, being applied to the contact-connection regions prior to the application of the glass layer by evaporation coating. This conductive material subsequently forms the via.

Figure 4A:
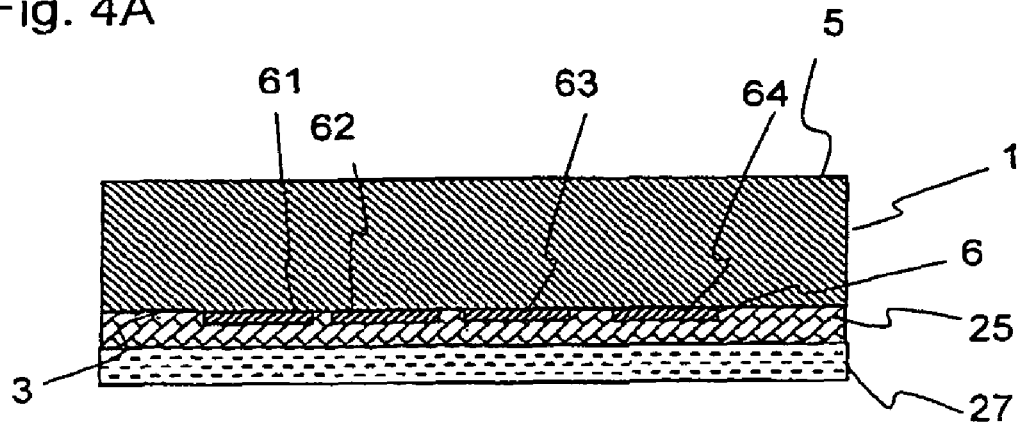
FIGS. 4A to 4E show a variant of the process steps of the process according to the invention illustrated in FIGS. 3B to 3E, FIG. 5 to 7 show embodiments of components according to the invention which have been provided with a conductor arrangement while still joined to the wafer.

In detail, first of all, starting from a substrate 1 which has been prepared as in FIG. 3A, a conductive layer 25 is formed, followed by a photographically structurable interlayer 27, as illustrated with reference to FIG. 4A.

Figure 4B:
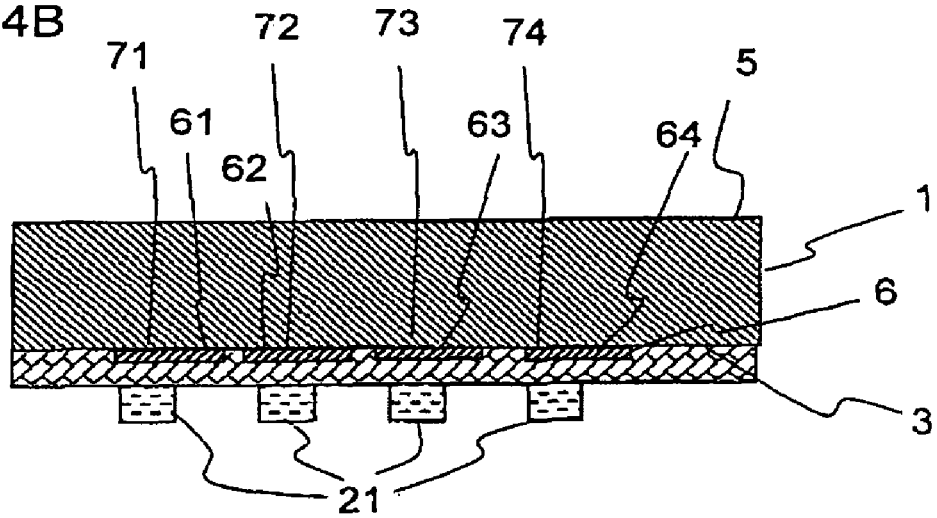
Figure 4C:
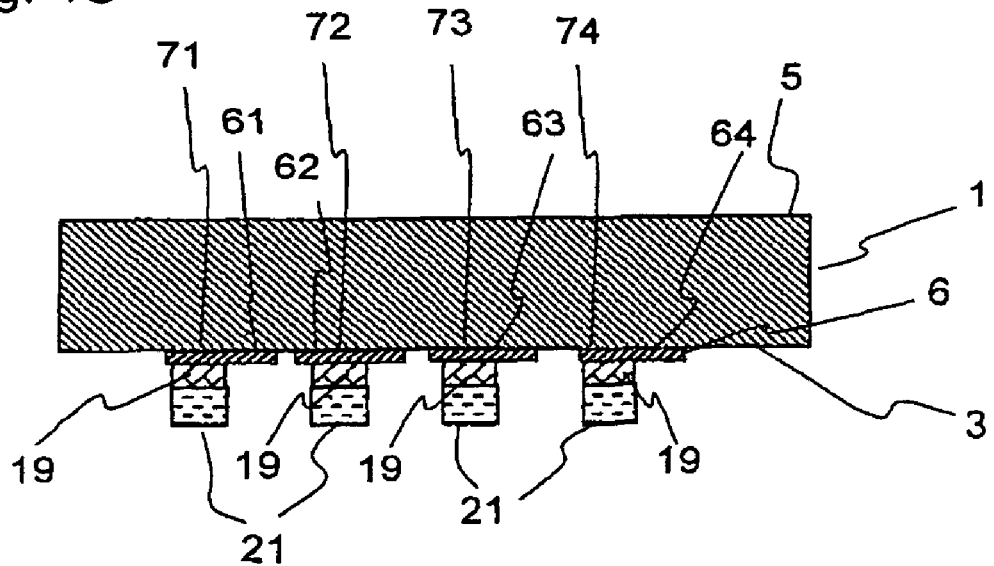

FIG. 4B shows the substrate after photolithographic structuring of the interlayer 27. The layer is structured in such a way that structures 21 which cover the intended contact-connection regions 71-74 remain in place. Then, as shown in FIG. 4C, the conductive layer 25 is removed from the uncovered regions surrounding the contact-connection regions 71-74. This can be carried out in a manner which is in standard usage in the specialist field, for example by etching. Accordingly, the contact-connection regions 71-74 are covered by a conductive material which is elevated or projects with respect to regions adjacent to the respective contact-connection region and which is in each case covered by a structure 21 of the interlayer 27.

Figure 4D:
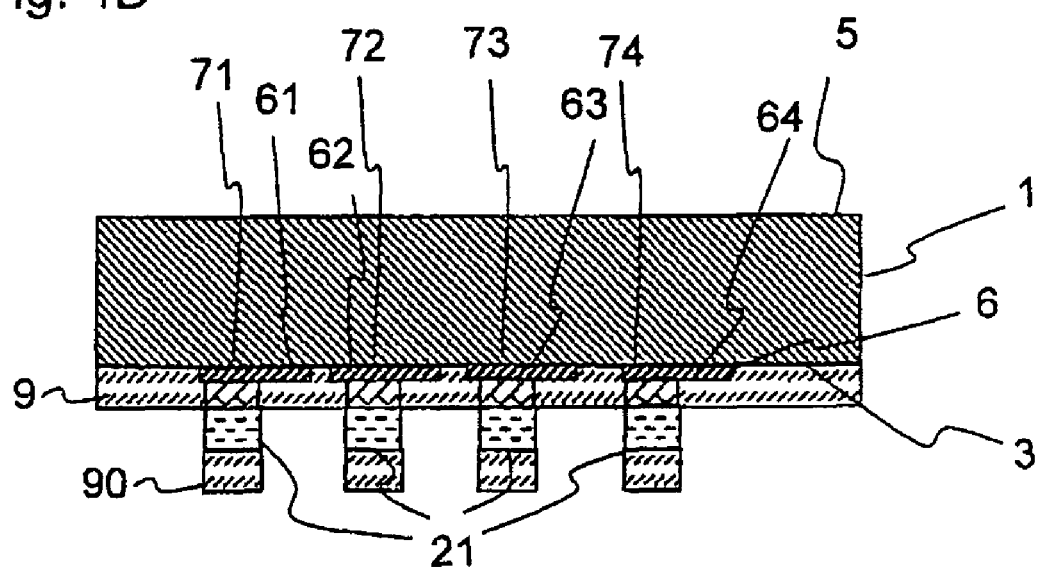
Figure 4E:
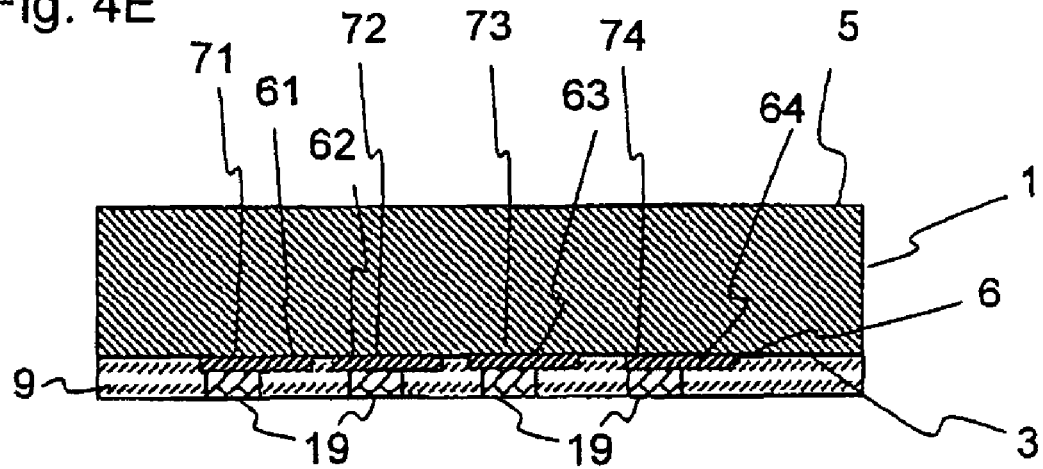

Then, as shown in FIG. 4D, the insulating glass layer 9 is applied by evaporation coating through evaporation of glass material according to the invention, the thickness of the glass layer 9 preferably being selected in such a way that it approximately corresponds to the thickness of the elevated conductive material 19. Finally, the structures 21 of the interlayer are removed, for example using a suitable solvent, and in the process the regions 90 of the glass layer 9 which cover the structures 21 are lifted off. The result is a substrate having a glass layer which has openings above the respective contact-connection regions and vias in the form of the conductive material located in the openings. This processing state is illustrated in FIG. 4E. As a result of appropriate selection of the layer thickness of the glass layer 9, which is matched to the thickness of the conductive material 19, the surface of the conductive material and of the glass layer 9 are at approximately the same height, resulting in a planar surface. The process can then be continued as explained with reference to FIGS. 3F to 3G, wherein the second glass layer 91 in FIG. 3G and any further glass layers can be produced with vias in the same or a similar way to that which has been explained with reference to FIGS. 4A to 4E.

Figure 6:
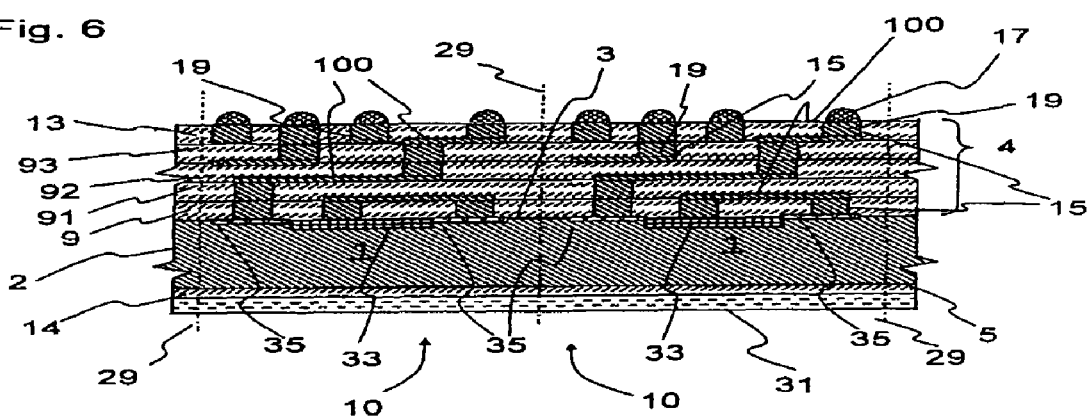
Figure 7:
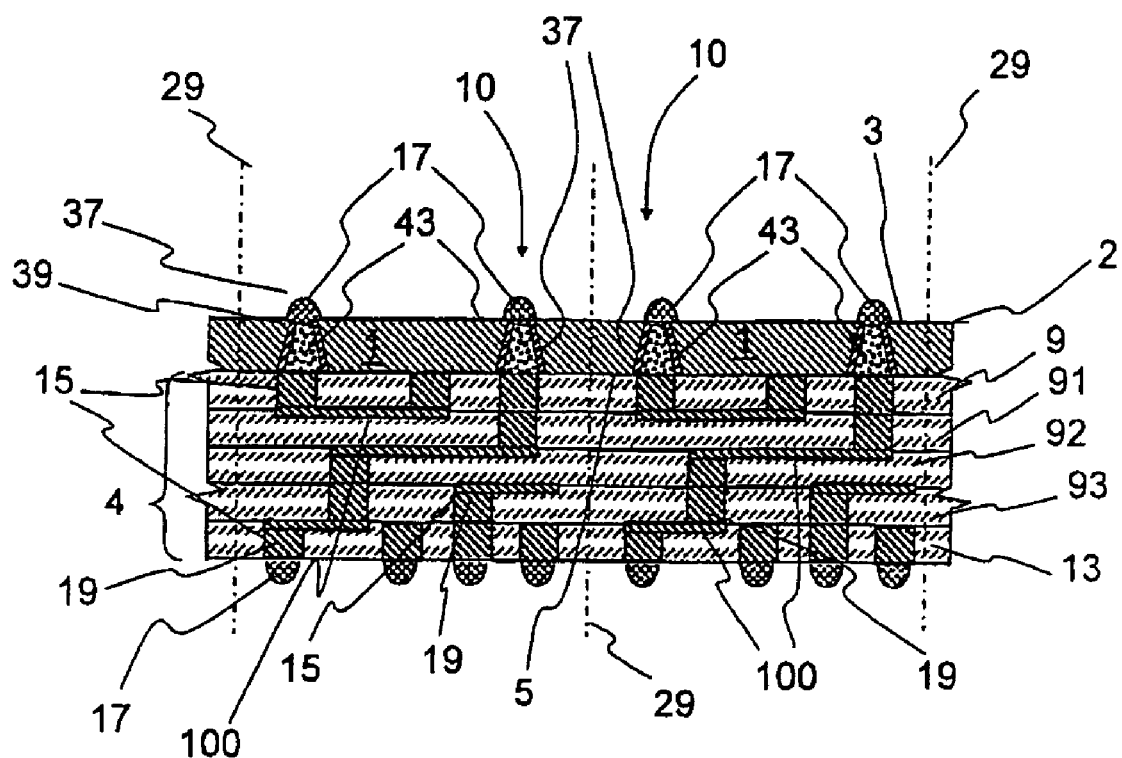

According to an advantageous refinement of the process, the components 10 are produced by coating substrates while they are still joined to the wafer. In this respect, FIGS. 5 to 7 show various embodiments of coated wafers 2, the components being obtained by separating individual substrates 1 from the wafer.

Figure 5:
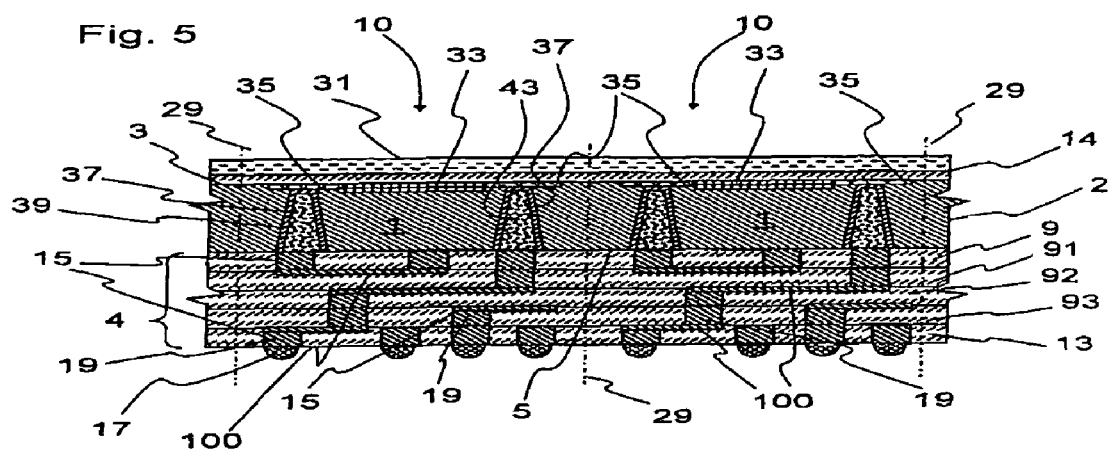

FIG. 5 shows an embodiment of the invention in which a semiconductor wafer 2 has been provided with a sequence of glass and interconnect layers. The wafer material used for this purpose is preferably silicon, since this material has a coefficient of thermal expansion which is very well matched to that of the evaporation-coating glass. Once they have been coated while still joined to the wafer and once the processing state shown in FIG. 5 has been produced, the individual substrates 1 are separated by being divided along the intended separation axes 29, in order ultimately to obtain components 10 with a conductor structure which is suitable for radio-frequency applications.

On a first side 3, the wafer 2 has individual active semiconductor regions 33 which are connected to connection locations 35.

In this embodiment of the invention, the conductor arrangement 4 is arranged on a second side 5 of the wafer 2, or of the substrates 1 of the wafer 2, this second side being on the opposite side from the first side having the active semiconductor regions 33.

The conductor arrangement 4 is illustrated in simplified form for the sake of clarity, with, inter alia, all the conductor structures being denoted by reference numeral 100. The individual layers of the conductor arrangement 4 may advantageously be produced as has been explained with reference to FIGS. 3A to 3G and/or FIGS. 4A to 4E. In particular, the conductor arrangement 4 shown in FIG. 5 is also produced in multilayer form, for which purpose accordingly the steps of depositing a structured glass layer and applying conductor structures 100 are correspondingly carried out a number of times, and with a conductor structure 100 which is applied at a later stage being brought into contact with a contact-connection region of a conductor structure 100 applied at an earlier stage.

Moreover, vias 37 through the substrates 1, which are electrically connected to the connection locations 35, are introduced into the wafer 2. The via may preferably be produced by etching pits into the wafer from the second side 5 to as far as the preferably metallic connection locations 35, which simultaneously act as an etching stop. Then, a passivation layer 39 is produced on the walls of the etching pit and the etching pit is filled with conductive material 43. The conductive material 43, which is uncovered on the side 3, of the vias 37 serves as a contact-connection region for conductor structures 100 of the conductor arrangement 4.

Moreover, the regions of the surface of the second side 5 having the vias are used as contact-connection regions for some of the conductor structures 100 of the conductor arrangement 4. If these conductor structures 100 are brought into contact with the contact-connection regions during application to the previously deposited glass layer 9, the conductor structures are accordingly also electrically connected to the connection locations 35 on the first side of the substrates 1. In this way, it is then possible for the active semiconductor regions 33 to be supplied via the conductor arrangement and for electrical signals from the active semiconductor regions to be emitted to the conductor structures 100 of the conductor arrangement 4.

To encapsulate and protect the components subsequently obtained by separation from the wafer, the embodiment shown in FIG. 5 is also provided with an additional encapsulation layer 14 of evaporation-coating glass and a plastics covering 31 on the side 3.

FIG. 6 shows a further embodiment of the invention, in which substrates which are likewise joined to the wafer have been coated with a conductor arrangement 4. This embodiment of the invention is similar to the embodiment shown in FIG. 5. A semiconductor wafer 2 with active semiconductor regions 33, which are assigned to individual substrates 1, is also used in the embodiment shown in FIG. 6. As in the embodiment shown in FIG. 5, during application of conductor structures 100 to the first glass layer 9 of the conductor arrangement 4, the connection locations 35 of the active semiconductor regions 33 are connected to conductor structures 100.

Unlike in the embodiment shown in FIG. 5, however, the glass layers 9, 91, 92, 93 and 13 of the conductor arrangement 4 are applied by evaporation coating to the first side 3 of the substrates 1, on which the active semiconductor regions 33 are also arranged. The vias 15 in the bottom glass layer 9 of the conductor arrangement 4 are applied direct to the contact locations 35, with the contact locations 35 accordingly forming the contact-connection regions of the substrates 1 for the corresponding conductor structures 100 on the first glass layer 9.

The components 10 which are obtained by separation from the coated wafers 2, as illustrated by way of example in FIGS. 5 and 6, may, for example, be designed as radio-frequency transmission/reception modules for frequencies above 10 GHz, in particular for frequencies in the range around 40 GHz or higher.

FIG. 7 shows yet another embodiment of substrates 1 which have been provided with a radio-frequency conductor arrangement 4 while still joined to the wafer in accordance with the invention. The conductor arrangement 4 comprising the glass layers 9, 91, 92, 93, 13 and the conductor structures 100 has in this case been applied to a wafer whose substrates 1 likewise have vias 37. The components 10 with substrates 1 and conductor arrangements 4, after they have been divided from the wafer, serve as radio-frequency rewiring substrate for further components which can be connected to the external contact locations of the components 10. The external contact locations are for this purpose provided, for example, with soldering beads 17, so that further components can be mounted and connected using surface-mounting technology. The substrates 1 in this case do not have any active components. Accordingly, the substrate wafer 2 may also be made from insulating material, such as for example glass or plastics. A glass which is particularly suitable for use as a material for the wafer or the substrates 1 of the components 10 is Borofloat®33 glass, which has a coefficient of thermal expansion which virtually coincides with that of the preferred evaporation-coating glass.

Figure 8:
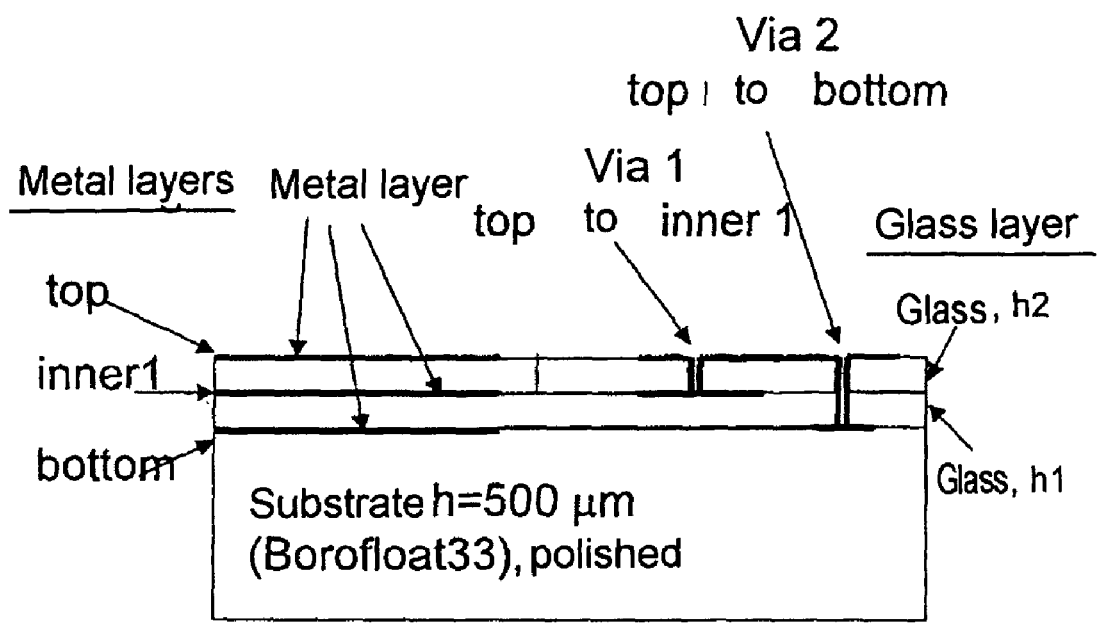
FIG. 8 shows a diagrammatic layer arrangement for an RF measurement structure.
Figure 9:
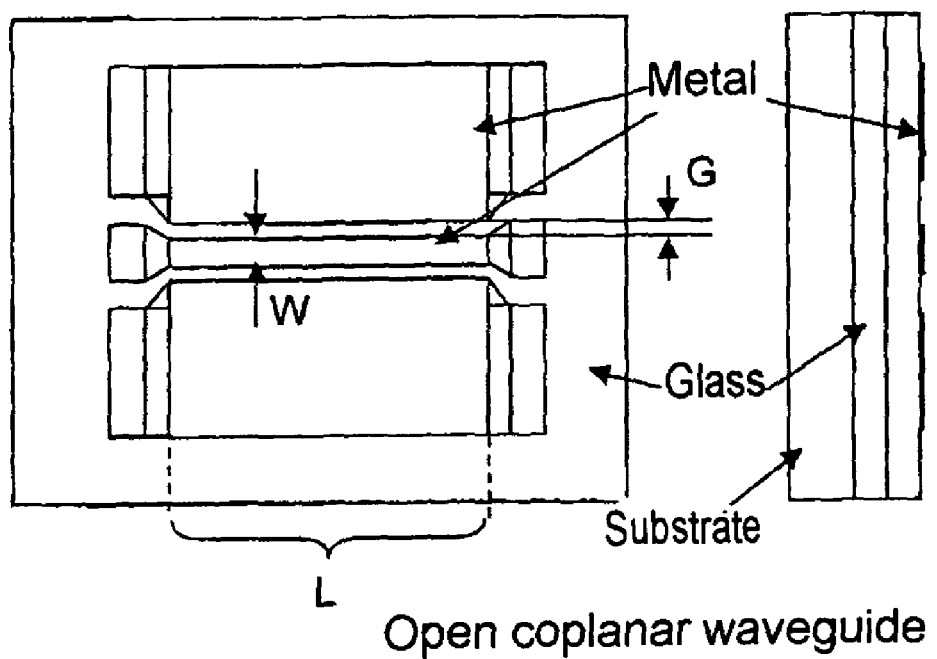
FIG. 9 shows a layer arrangement for open coplanar waveguides CPW 1/2.
Figure 10:
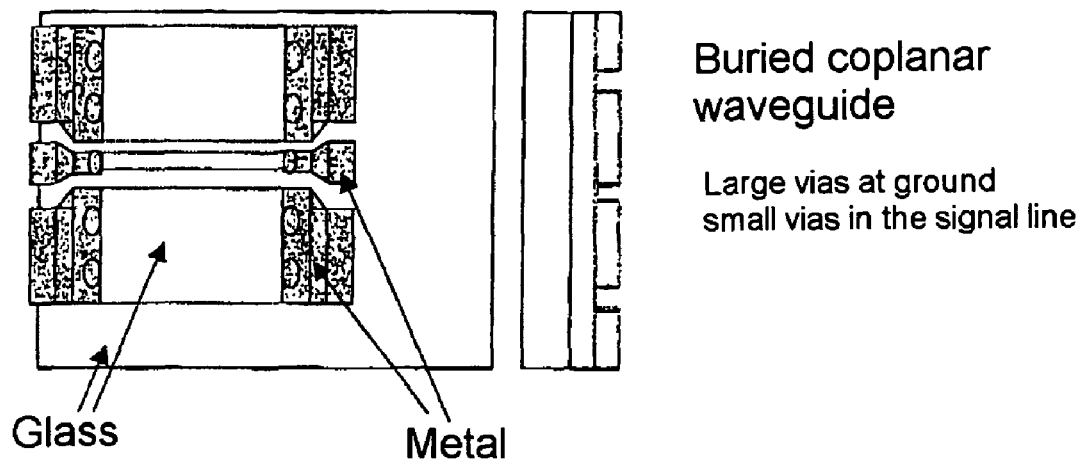
FIG. 10 shows a layer arrangement for buried coplanar waveguides CPW 3.

FIG. 8 shows the diagrammatic layer arrangement, for characterization of the RF properties, including the layer thicknesses of the measured test structures. FIGS. 9 and 10 illustrate realized structures of open and buried coplanar waveguides. The following measurements of the scatter parameters S12, S21, S11 and S22 were realized on the basis of these structures. The specimen designations for the selected measurements, shown in FIGS. 12 to 23, are to be found in the table illustrated in FIG. 11.

FIGS. 12 to 14 show the magnitude of the scatter parameters S11 and S22, S12 and S21, and the phase profile of the scatter parameter S12 and S21 of an open coplanar waveguide using the glass 8329 as an insulator between the aluminum interconnects. The scatter parameters S12 and S21 are also referred to as transmission attenuation and the scatter parameters S11 and S22 as reflection attenuation.

FIG. 12 clearly reveals an extremely low reflection S11 and S22 of the signals at this specimen from −20 dB to −40 dB up to a frequency of 50 GHz. Furthermore, low attenuation values of less than <−2 dB for the scatter parameters S12 and S21 are apparent from the measured values illustrated in FIG. 13 up to a frequency of 50 GHz. The scatter parameters S21 and S12, which represent the values for the transmission of the electrical signal at the respective frequency, are shown up to a frequency of 50 GHz. The linear phase profile of the scatter parameter S21 has a very low dispersion up to a frequency of 50 GHz.

The measured values shown with reference to FIGS. 12 to 14 can also be verified by measurements carried out on further specimens, according to which:

FIGS. 15 to 17 show measured values for a buried coplanar waveguide with glass 8329, FIGS. 18 to 20 show measured values for an open coplanar waveguide with glass 8329, and FIGS. 21 to 23 show measured values for a buried coplanar waveguide with glass G018-189.

These measurements reveal a trend toward lower attenuation of the scatter parameters S12 and S21 when using the RF glass G018-189.

| List of reference symbols | |
|---|---|
| 1 | Substrate |
| 2 | Semiconductor wafer |
| 3 | First side of 1 |
| 4, 41, 42 | Conductor arrangement |
| 5 | Second side of 1 |
| 6 | Layer with conductor structures on 1 |
| 61-64 | Conductor structures of 6 |
| 71-74 | Contact-connection regions |
| 8 | Openings in 9 above contact-connection regions 71-74 |
| 9, 91-93 | Evaporation-coating glass layer |
| 10 | Component |
| 11 | Layer with conductor structures |
| 100, 111, 112, 113 | Conductor structures |
| 13 | Final evaporation-coating glass layer |
| 14 | Evaporation-coating glass encapsulation layer |
| 15 | Via |
| 17 | Soldering beads |
| 19 | Conductive material |
| 21 | Resist structures of an interlayer |
| 23 | Passive electrical component |

-continued

| List of reference symbols | |
|---|---|
| 25 | Conductive layer |
| 27 | Photographically structurable interlayer |
| 29 | Separating axis |
| 31 | Plastic covering |
| 33 | Active semiconductor region |
| 35 | Connection location of 33 |
| 37 | Via through 1 |
| 39 | Passivation layer |
| 43 | Conductive filler of 37 |
| 75, 76 | Contact-connection regions |
| 90 | Region of the evaporation-coating glass layer on resist structure |

The invention claimed is:

1. A process for producing a multi-layer wiring for a radio-frequency driven chip, comprising the steps of:
   using the radio-frequency driven chip as a carrier and a substrate when producing the multi-layer wiring;
   arranging a contact-connecting region on the substrate for electrical interconnection with the radio-frequency driven chip;
   depositing a structured glass layer having a loss factor tan δ of less than or equal to $70*10^{-4}$ in at least a frequency range above 1 GHz and at least one opening over the contact-connection region; and
   applying at least one conductor structure to the structured glass layer, wherein the at least one conductor structure has electrical contact with the contact-connection region, wherein said step of depositing a structured glass layer comprises electron beam evaporation of glass material from a target that is arranged opposite and at a distance from the substrate to be coated, and wherein said step of depositing a structured glass layer comprises depositing a material having the following composition in percent by weight:

| | |
|---|---|
| $SiO_2$ | 71 ± 5, |
| $B_2O_3$ | 26 ± 5, |
| $Al_2O_3$ | 1 ± 0.2, |
| $K_2O$ | 1 ± 0.2, |
| $Li_2O$ | 0.5 ± 0.2, and |
| $Na_2O$ | 0.5 ± 0.2. |

2. The process as claimed in claim 1, further comprising applying at least one passive electrical component, which is in contact with the at least one conductor structure, to the structured glass layer.

3. The process as claimed in claim 1, further comprising repeating the steps of depositing a structured glass layer and of applying at least one conductor structure a number of times.

4. The process as claimed in claim 1, wherein the step of depositing the structured glass layer comprises the steps of:
   applying a structured interlayer to cover the contact-connection region;
   applying the structured glass layer by evaporation coating to the substrate and the structured interlayer which is present thereon, the thickness of the structured glass layer being less than that of the structured interlayer; and
   removing the structured interlayer so that regions of the structured glass layer which are located on the structured interlayer are lifted with it.

5. The process as claimed in claim 4, wherein prior to the application of the structured glass layer by evaporation coating, the method further comprises applying a conductive material that projects with respect to regions adjacent to the contact-connection region to the contact-connection region, and covering the conductive material by the structured interlayer.

6. The process as claimed in claim 4, wherein the step of applying the structured interlayer comprises printing or photolithographic structuring.

7. The process as claimed in claim 1, wherein the step of applying the at least one conductor structure comprises the steps of applying a negatively structured interlayer and depositing a conductive material.

8. The process as claimed in claim 1, wherein the at least one conductive structure is applied to the substrate prior to the step of depositing the structured glass layer.

9. The process as claimed in claim 1, further comprising the step of depositing a final glass layer and producing at least one via in the final glass layer.

10. The process as claimed in claim 1, wherein the substrate comprises a semiconductor substrate with active semiconductor regions, and wherein the step of applying the at least one conductor structure comprises connecting the at least one conductor structure to a connection location of the active semiconductor region.

11. The process as claimed in claim 1, wherein the step of applying the at least one conductor structure comprises connecting the at least one conductor structure to a via through the substrate.

12. The process as claimed in claim 1, wherein the substrate, during the application of the structured glass layer, is held at a temperature between 50° C. and 200° C.

13. The process as claimed in claim 1, wherein the step of depositing a structured glass layer comprises evaporation coating with a deposition rate of at least 0.1 µm of layer thickness per minute.

14. The process as claimed in claim 1, further comprising the step of filling in the at least one opening with a conductive material.

15. The process as claimed in claim 1, wherein the step of depositing the structured glass layer on the substrate is carried out while the substrate is joined to a wafer.

16. The process as claimed in claim 1, wherein the step of depositing the structured glass layer comprises plasma ion assisted deposition (PIAD).

17. A process for producing a multi-layer wiring for a radio-frequency driven chip on a substrate, comprising the steps of:
   applying at least one conductor structure on a first side of the substrate for electrical interconnection with the radio-frequency driven chip;
   defining a contact-connection region of the at least one conductor structure;
   depositing an insulating glass layer, in structured form, on the first side of the substrate by electron beam evaporation coating such that the insulating glass layer has an opening at the contact-connection region;
   filling the opening with a conductive material so that the conductive material is electrically connected to the at least one conductor structure; and
   applying at least one further conductor structure on the insulating glass layer, the at least one further conductor structure being electrically connected to the at least one conductor structure by the conductive material, wherein the step of depositing an insulating glass layer comprises depositing a material having the following composition in percent by weight:

| | |
|---|---|
| $SiO_2$ | 71 ± 5, |
| $B_2O_3$ | 26 ± 5, |
| $Al_2O_3$ | 1 ± 0.2, |
| $K_2O$ | 1 ± 0.2, |
| $Li_2O$ | 0.5 ± 0.2, and |
| $Na_2O$ | 0.5 ± 0.2. |

18. The process as claimed in claim 17, wherein the insulating glass layer has a loss factor tan δ of less than or equal to $70*10^{-4}$ in at least a frequency range above 1 GHz.

19. The process as claimed in claim 17, wherein the step of depositing the insulating glass layer comprises evaporating a target arranged opposite and at a distance from the first side.

20. The process as claimed in claim 17, wherein the step of depositing the insulating glass layer comprises the steps of:
   applying a structured interlayer to cover the contact-connection region;
   applying the insulating glass layer; and
   removing the structured interlayer so that a region of the insulating glass layer on the structured interlayer is lifted to define the opening.

21. A process for producing a multi-layer wiring for a radio-frequency driven chip on a substrate, comprising the steps of:
   applying a first conductor structure to a first side of the substrate for electrical interconnection with the radio-frequency driven chip, the first conductor structure having a contact-connection region;
   depositing, via electron beam evaporation, an insulating glass layer on the first side such that the insulating glass layer has an opening at the contact-connection region, the insulating glass layer comprises a material having the following composition in percent by weight: $SiO_2$ 71±5, $B_2O_3$ 26±5, $Al_2O_3$ 1±0.2, $K_2O$ 1±0.2, $Li_2O$ 0.5±0.2, and $Na_2O$ 0.5±0.2;
   filling the opening with conductive material to electrically connect the conductive material, the first conductor structure, and a second conductor structure; and
   applying the second conductor structure to the insulating glass layer.

22. The process as claimed in claim 21, further comprising:
   depositing, via electron beam evaporation, a second insulating glass layer covering the second conductor structure, the second insulating glass layer comprises a material having the following composition in percent by weight: $SiO_2$ 71±5, $B_2O_3$ 26±5, $Al_2O_3$ 1±0.2, $K_2O$ 1±0.2, $Li_2O$ 0.5±0.2, and $Na_2O$ 0.5±0.2; and
   producing at least one via in the second insulating glass layer.

* * * * *